(12) United States Patent
Yang

(10) Patent No.: US 11,942,917 B2
(45) Date of Patent: Mar. 26, 2024

(54) FILM BULK ACOUSTIC RESONATOR AND FABRICATION METHOD THEREOF

(71) Applicant: Ningbo Semiconductor International Corporation, Ningbo (CN)

(72) Inventor: Guohuang Yang, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 406 days.

(21) Appl. No.: 17/249,391

(22) Filed: Mar. 1, 2021

(65) Prior Publication Data

US 2021/0184643 A1 Jun. 17, 2021

Related U.S. Application Data

(63) Continuation of application No. PCT/CN2020/099741, filed on Jul. 1, 2020.

(30) Foreign Application Priority Data

Jul. 19, 2019 (CN) .......................... 201910657440.7

(51) Int. Cl.
*H03H 3/02* (2006.01)
*H03H 9/05* (2006.01)
*H03H 9/17* (2006.01)

(52) U.S. Cl.
CPC ............ *H03H 3/02* (2013.01); *H03H 9/0514* (2013.01); *H03H 9/173* (2013.01); *H03H 2003/021* (2013.01)

(58) Field of Classification Search
CPC ............................. H03H 9/0514; H03H 9/173
See application file for complete search history.

(56) References Cited

U.S. PATENT DOCUMENTS

| 6,713,314 B2 | 3/2004 | Wong et al. | |
| 10,797,681 B1* | 10/2020 | Hurwitz | ............ H01L 21/76871 |
| 2004/0032012 A1 | 2/2004 | Wong et al. | |
| 2005/0062558 A1* | 3/2005 | Sunwoo | ................... H03H 3/02 333/133 |
| 2008/0061907 A1* | 3/2008 | Lee | .......................... H03H 3/02 333/191 |

(Continued)

FOREIGN PATENT DOCUMENTS

| CN | 102025340 A | 4/2011 |
| CN | 102933318 A | 2/2013 |

(Continued)

*Primary Examiner* — Bryan P Gordon
(74) *Attorney, Agent, or Firm* — Anova Law Group, PLLC

(57) ABSTRACT

The present disclosure provides a film bulk acoustic resonator and its fabrication method. The fabrication method includes providing a first substrate, and sequentially forming a first electrode layer, a piezoelectric material layer, and a second electrode layer, on the first substrate; forming a support layer on the second electrode layer and forming a cavity with a top opening in the support layer, where the cavity passes through the support layer; providing a second substrate and bonding the second substrate with the support layer; removing the first substrate; and patterning the first electrode layer, the piezoelectric material layer, and the second electrode layer to form a first electrode, a piezoelectric layer, and a second electrode.

11 Claims, 7 Drawing Sheets

(56) References Cited

U.S. PATENT DOCUMENTS

| | | | | |
|---|---|---|---|---|
| 2011/0006860 A1* | 1/2011 | Hara | ................ | H03H 9/02118 |
| | | | | 333/187 |
| 2011/0298564 A1* | 12/2011 | Iwashita | ............... | H03H 9/173 |
| | | | | 333/187 |
| 2013/0147319 A1* | 6/2013 | Adkisson | ............ | H03H 9/1085 |
| | | | | 438/5 |
| 2018/0278227 A1* | 9/2018 | Hurwitz | ................ | H03H 9/581 |
| 2018/0309427 A1* | 10/2018 | Kim | ................ | H03H 9/02118 |

FOREIGN PATENT DOCUMENTS

| | | | |
|---|---|---|---|
| CN | 103296992 | A | 9/2013 |
| CN | 106209003 | A | 12/2016 |
| CN | 107222181 | A | 9/2017 |
| CN | 107809221 | A | 3/2018 |
| CN | 109150135 | A | 1/2019 |
| CN | 109309483 | A | 2/2019 |
| CN | 111130483 | A | 5/2020 |
| JP | 200686787 | A | 3/2006 |
| JP | 200898831 | A | 4/2008 |
| JP | 2013512583 | A | 4/2013 |
| JP | 2016140053 | A | 8/2016 |
| JP | 2018129561 | A | 8/2018 |
| JP | 2018190891 | A | 11/2018 |
| JP | 2018537672 | A | 12/2018 |
| JP | 2019105447 | A | 6/2019 |
| WO | 2008101646 | A1 | 8/2008 |

\* cited by examiner

FILM BULK ACOUSTIC RESONATOR AND FABRICATION METHOD THEREOF

CROSS-REFERENCE TO RELATED APPLICATIONS

This application is a continuation application of PCT Patent Application No. PCT/CN2020/099741, filed on Jul. 1, 2020, which claims priority to Chinese patent application No. 201910657440.7, filed on Jul. 19, 2019, the entirety of all of which is incorporated herein by reference.

FIELD OF THE DISCLOSURE

The present disclosure generally relates to the field of semiconductor manufacturing, and more particularly, relates to a film bulk acoustic resonator and its fabrication method.

BACKGROUND

Radio frequency filters are required in radio frequency (RF) communications, such as mobile phone communication. Each radio frequency filter may transmit its required frequency and limit all other frequencies. With the development of mobile communication technology, the quantity of mobile data transmission has increased rapidly. Therefore, under the premise that frequency resources are limited and as few mobile communication devices as possible should be used, increasing the transmission power of wireless power transmission equipment, such as wireless base stations, micro base stations or repeaters, must be considered; meanwhile, it also indicates that the filter power requirement in the front-end circuits of mobile communication equipment has continuously increased.

Currently, high-power filters in equipment such as wireless base stations are mainly cavity filters with power reaching hundreds of watts, but the sizes of such filters are extremely large. Dielectric filters, which may have the average power reaching more than 5 watts, may also be used in certain equipment, but the sizes of the filters are also extremely large. Such two types of filters cannot be integrated into the RF front-end chips due to their large sizes.

As MEMS technology has been well developed, filters composed of bulk acoustic resonators may effectively overcome the defects of the above-mentioned two types of filters. Film Bulk Acoustic Resonators (FBAR), a hot spot in the market, have various advantages such as high operation frequency, small insertion loss, high Q value, high withstand power, and small size, which may meet the urgent needs of high-frequency and miniaturized RF filters in the RF transceiver front ends of electronic systems, such as communications, radars, and the like.

The core structure of the film bulk acoustic resonator is a stacked structure ("sandwich" structure) composed of an upper electrode—a piezoelectric film layer—a lower electrode. Its working principle is described as the following. The inverse piezoelectric effect of the piezoelectric film layer is used to convert electrical energy into mechanical energy; the mechanical vibration excites acoustic waves in the film for transmission; finally, the acoustic signal is converted into an electrical signal output through the piezoelectric effect. The most important feature of the resonator is to ensure that the energy of the acoustic wave is limited to the piezoelectric film layer in addition to ensuring the piezoelectric performance of the piezoelectric film layer. Therefore, a cavity is provided below the region of the lower electrode of the film bulk acoustic resonator facing the upper electrode.

The film bulk acoustic resonator may be fabricated on a substrate material through a deposition process. After the stacked structure composed of the upper electrode, the piezoelectric film layer and the lower electrode is formed, a cavity needs to be formed under the stacked structure, which makes the fabrication of the film bulk acoustic resonator relatively difficult. An existing technology illustrated in FIGS. 1A-1E may be described as the following. A trench 110' may be first formed on a substrate 100, as shown in FIG. 1A; then, a sacrificial layer material may be filled in the trench 110', and the surfaces of the substrate 100 and the sacrificial layer material may be planarized by a chemical mechanical polishing (CMP) process to form a sacrificial layer 101, as shown in FIG. 1B; next, a first electrode 102, a piezoelectric film layer 103, and a second electrode 104 may be sequentially deposited on the surfaces of the planarized substrate 100 and the sacrificial layer 101, as shown in FIG. 1C; then, the piezoelectric film layer 103 and the second electrode 104 may be patterned, and only the piezoelectric film layer 103 and the second electrode 104 above the sacrificial layer 101 may be retained, as shown in FIG. 1D; next, a plurality of through holes 120 may be disposed at the first electrode 102 which is above the sacrificial layer 101 and not covered by the piezoelectric film layer 103 and the second electrode 104, as shown in FIG. 1D; finally, the formed device may be placed in a chemical reagent which etches away the material of the sacrificial layer through the through holes 120 to release the sacrificial layer 101 to form a cavity 110, thereby realizing the floating arrangement of the film bulk acoustic resonator, as shown in FIG. 1E.

However, the above-mentioned method still has a plurality of shortcomings. For example, when the CMP process is performed on the substrate 100 and the sacrificial material using the above-mentioned method, small recessions may be formed in the region of the sacrificial layer 101 due to the difference in polishing rates, which may affect the subsequent growth uniformity of the piezoelectric layer 103, and eventually affect the performance of the film bulk resonator. Moreover, the method needs the fabrication of the sacrificial layer 101; and during the releasing process of the sacrificial layer 101, the related film of the film bulk acoustic resonator is easily broken. Furthermore, if the sacrificial layer 101 is not released completely to have certain impurity residuals, it may greatly reduce the Q value of the film bulk acoustic resonator and affect the quality of the film bulk acoustic resonator.

BRIEF SUMMARY OF THE DISCLOSURE

One aspect of the present disclosure provides a method for fabricating a film bulk acoustic resonator, including:
  providing a first substrate, and sequentially forming a first electrode layer, a piezoelectric material layer, and a second electrode layer, on the first substrate;
  forming a support layer on the second electrode layer and forming a cavity with a top opening in the support layer, where the cavity passes through the support layer;
  providing a second substrate and bonding the second substrate with the support layer;
  removing the first substrate; and
  patterning the first electrode layer, the piezoelectric material layer, and the second electrode layer to form a first electrode, a piezoelectric layer, and a second electrode.

Another aspect of the present disclosure provides a film bulk acoustic resonator, including:
- a second substrate;
- a support layer bonded on the second substrate, where a cavity, passing through the support layer, is disposed in the support layer; and
- a second electrode, a piezoelectric layer, and a first electrode which are sequentially disposed on the support layer.

Other aspects of the present disclosure can be understood by those skilled in the art in light of the description, the claims, and the drawings of the present disclosure.

BRIEF DESCRIPTION OF THE DRAWINGS

In order to clearly explain the technical solutions in the embodiments of the present disclosure or the existing technology, the drawings that need to be used in the description of the embodiments or the existing technology are illustrated hereinafter. Obviously, the drawings in the following description are merely some embodiments of the present disclosure. For those skilled in the art, other drawings can be obtained based on such drawings without creative work.

DETAILED DESCRIPTION

A film bulk acoustic resonator and a fabrication method of film bulk acoustic resonator in the present disclosure may be further described in detail with reference to the accompanying drawings and specific embodiments hereinafter. The advantages and features of the present disclosure may be more apparent according to the following description and the accompanying drawings. However, it should be noted that the concept of the technical solution of the present disclosure may be implemented in various different forms and may not be limited to specific embodiments set forth herein. The accompanying drawings may be all in simplified forms and non-precise scales and may be merely for convenience and clarity of the purpose of the embodiments of the present disclosure.

The terms "first", "second" and the like in the specification and the claims may be used to distinguish similar elements and may be not necessarily used to describe a particular order or chronological order. It should be understood that the used terms may be substituted, as appropriate. For example, the embodiments described herein of the present disclosure may be enabled to operate in other sequences than sequences described or illustrated herein. Similarly, if the method described herein comprise a series of steps, the order of the steps presented herein may not be necessarily the only order in which the steps may be performed, and some of the steps may be omitted and/or other steps, which are not described herein, may be added to the method. If components in one of the drawings are same as components in other drawings, although the components may be easily recognized in all drawings, in order to make the description of the drawings clearer, labels of all the same components may not be marked in each figure in the present specification.

Figure 1A:
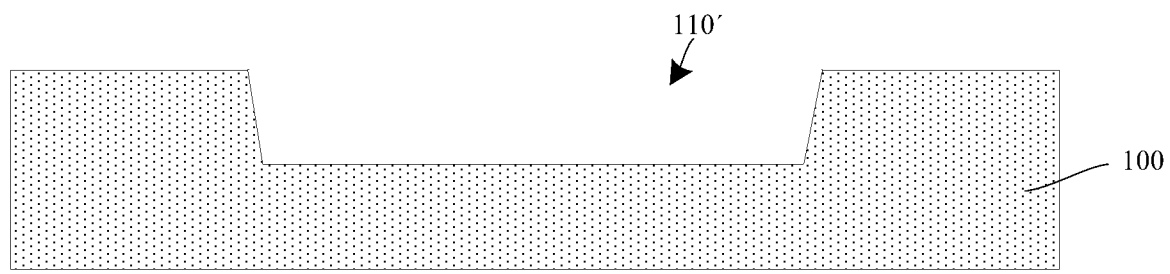
FIGS. 1A-1E illustrate structural schematics corresponding to certain stages of a fabrication method of a film bulk acoustic resonator.
Figure 1B:
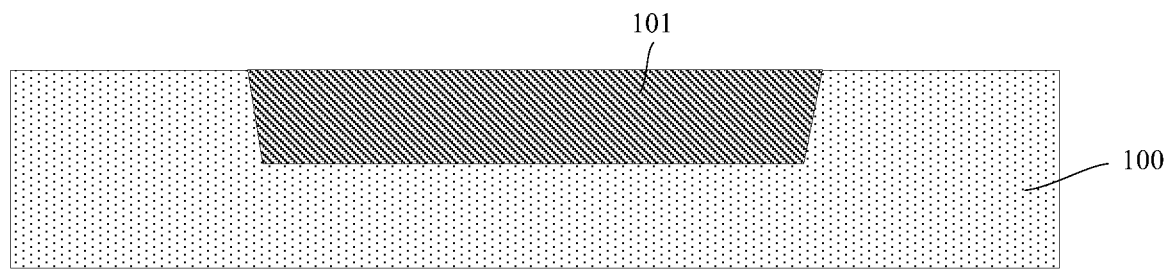
Figure 1C:
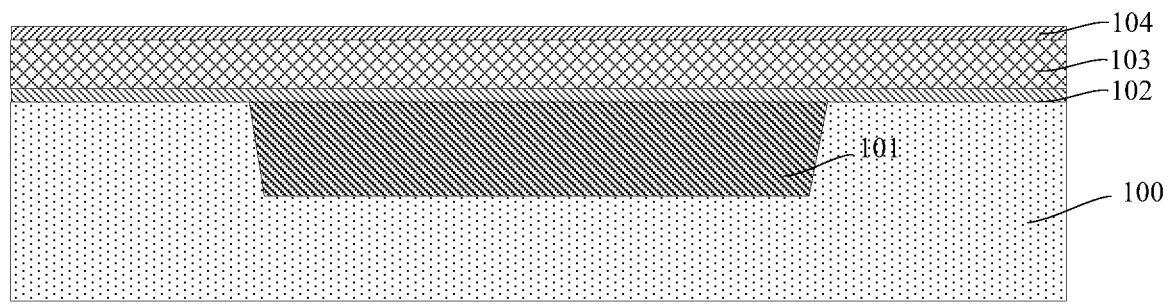
Figure 1D:
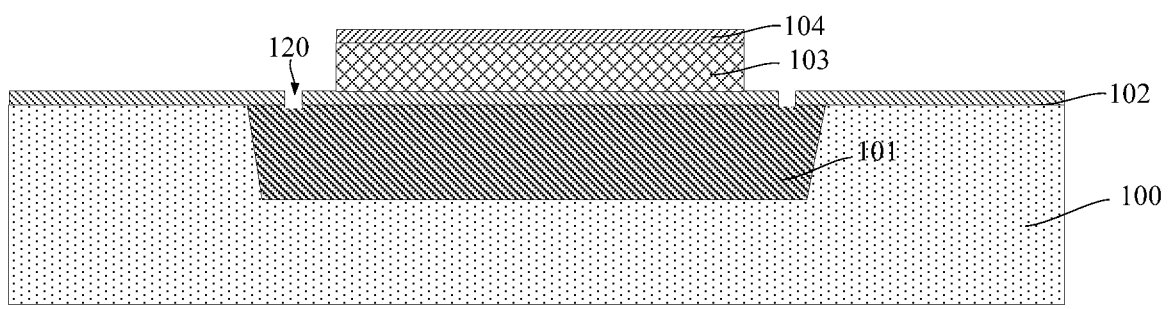
Figure 1E:
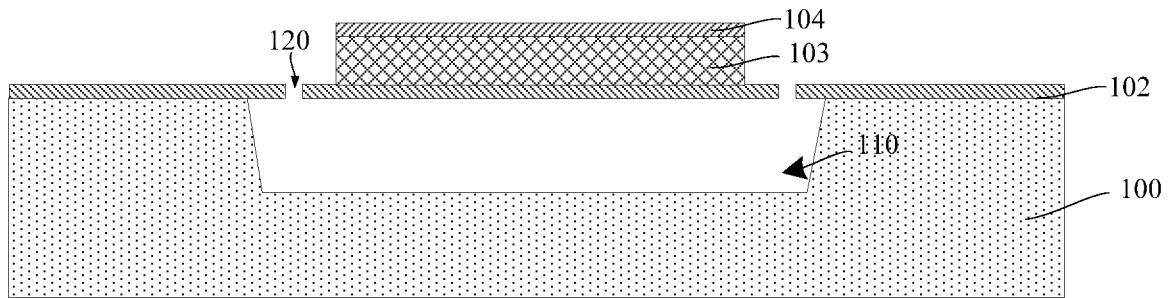
Figure 2:
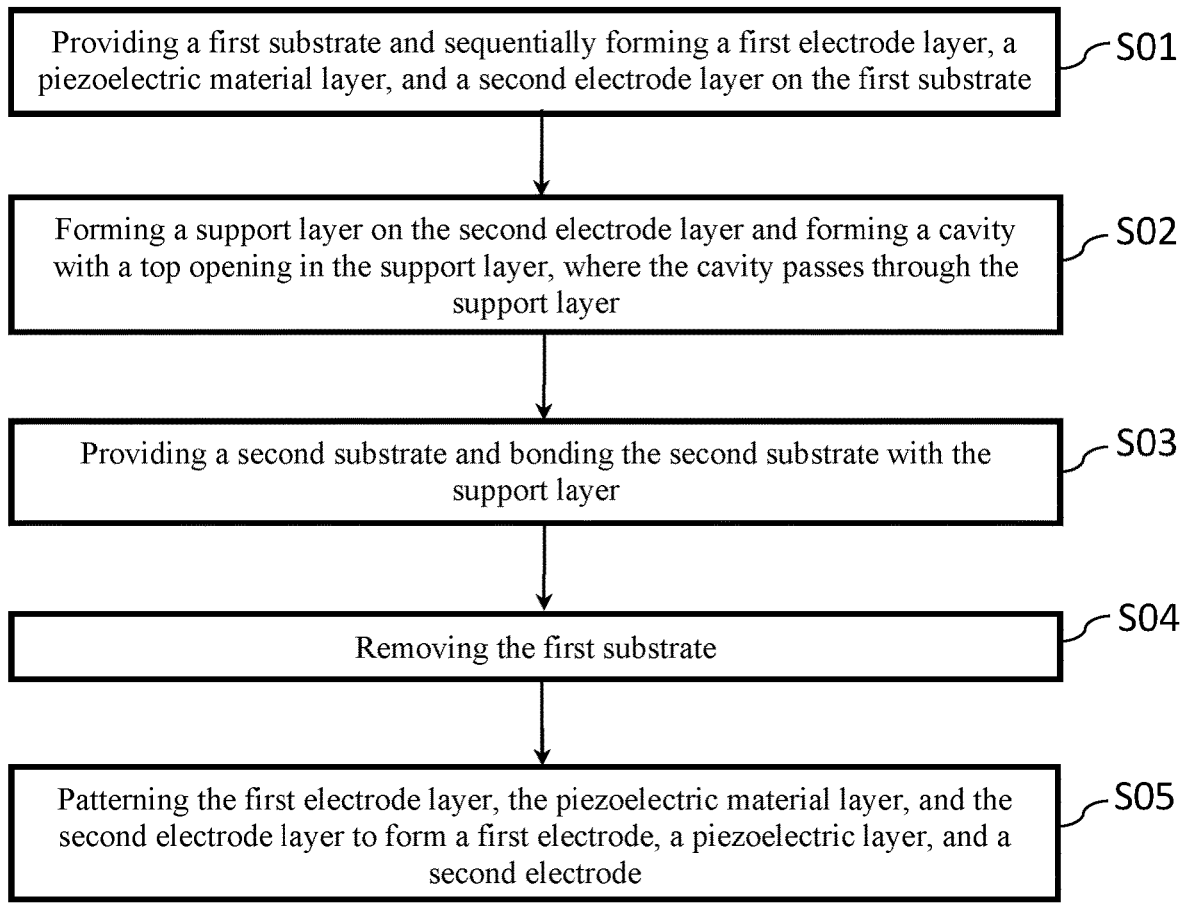
FIG. 2 illustrates a flowchart of a fabrication method of a film bulk acoustic resonator according to various embodiments of the present disclosure.

Various embodiments of the present disclosure provide a fabrication method of a film bulk acoustic resonator. For example, as shown in FIG. 2, an exemplary fabrication method of a film bulk acoustic resonator may include the following:

S01, providing a first substrate and sequentially forming a first electrode layer, a piezoelectric material layer, and a second electrode layer on the first substrate;

S02, forming a support layer on the second electrode layer and forming a cavity with a top opening in the support layer, where the cavity passes through the support layer;

S03, providing a second substrate and bonding the second substrate with the support layer;

S04, removing the first substrate; and

S05, patterning the first electrode layer, the piezoelectric material layer, and the second electrode layer to form a first electrode, a piezoelectric layer, and a second electrode.

FIGS. 3A-3K illustrate structural schematics corresponding to certain stages of the fabrication method of the film bulk acoustic resonator according to various embodiments of the present disclosure. The fabrication method of the film bulk acoustic resonator provided in one embodiment is described in detail with reference to FIG. 2 and FIGS. 3A-3K hereinafter.

Figure 3A:
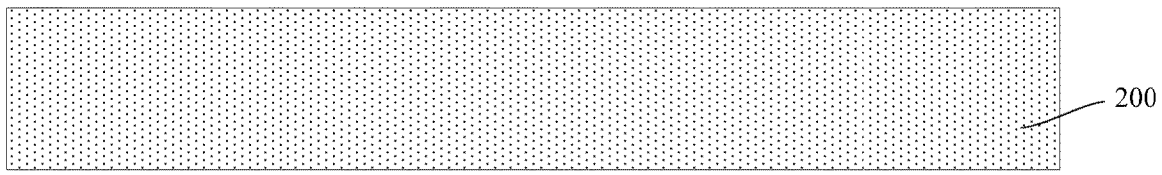
FIGS. 3A-3K illustrate structural schematics corresponding to certain stages of a fabrication method of a film bulk acoustic resonator according to various embodiments of the present disclosure.

As shown in FIG. 3A, a first substrate 200 may first be provided. The first substrate 200 may be any suitable substrate known to those skilled in the art. For example, the first substrate 200 may be at least one of the materials mentioned below: silicon (Si), germanium (Ge), silicon germanium (SiGe), silicon carbon (SiC), silicon germanium (SiGeC), indium arsenide (InAs), gallium arsenide (GaAs), indium phosphide (InP) or other III/V compound semiconductors. The first substrate may also be a multilayer structure composed of above-mentioned semiconductors; or silicon-on-insulator (SOI), silicon-on-insulator (SSOI), silicon-germanium-on-insulator (S—SiGeOI), silicon germanium-on-insulator (SiGeOI), and germanium-on-insulator (GeOI); or double side polished wafers (DSP), a ceramic substrate such as alumina, a quartz or glass substrate, and the like.

Figure 3B:
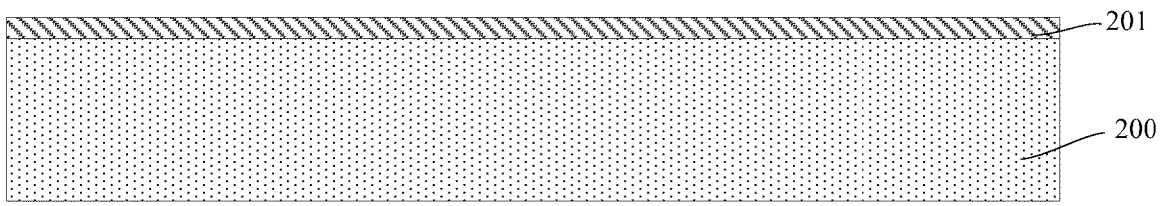

Optionally, as shown in FIG. 3B, a release layer 201 may be formed on the first substrate 200. The release layer 201 may prevent the piezoelectric stacked layer structure of the film bulk acoustic resonator formed subsequently from affecting the first substrate 200; meanwhile, in the subsequent removal process of the first substrate 200, the first substrate 200 may be separated from the piezoelectric stacked layer structure formed subsequently by the manner of etching the release layer 201, which is beneficial for rapid removing the first substrate 200 and improving the manufacturing efficiency of the process. The release layer is made of a material including a dielectric material, a light solidification adhesive, a thermally melt adhesive, a laser release material, or a combination thereof. For example, the material of the release layer 201 may include silicon dioxide ($SiO_2$), silicon nitride ($Si_3N_4$), aluminum oxide ($Al_2O_3$), and aluminum nitride (AlN). The release layer 201 may be formed by a process including chemical vapor deposition, magnetron sputtering, evaporation, and the like. In one embodiment, the first substrate 200 may be a silicon wafer; and the material of the release layer 201 may be silicon dioxide ($SiO_2$).

Figure 3C:
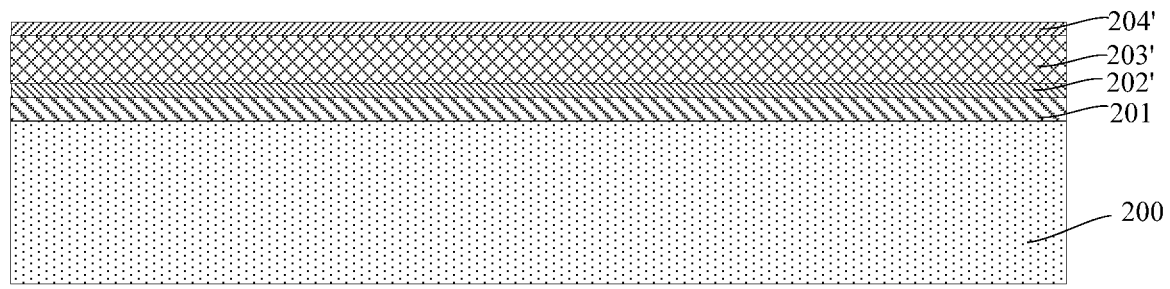

Next, as shown in FIG. 3C, a piezoelectric stacked layer structure may be formed on the release layer 201; and the piezoelectric stacked layer structure may include a first electrode layer 202', a piezoelectric material layer 203', and a second electrode layer 204', where the piezoelectric material layer 203' may be located between the first electrode layer 202' and the second electrode layer 204'; and the first electrode layer 202' and the second electrode layer 204' may be disposed oppositely. The first electrode layer 202' may be used as an input electrode or an output electrode which receives or provides electrical signals such as radio frequency (RF) signals. For example, when the second electrode layer 204' is used as the input electrode, the first electrode layer 202' may be used as the output electrode; when the second electrode layer 204' is used as the output electrode, the first electrode layer 202' may be used as the input electrode; and the piezoelectric material layer 203' may convert the electrical signal inputted through the first electrode layer 202' or the second electrode layer 204' into the bulk acoustic wave. For example, the piezoelectric material layer 203' may convert the electrical signal into bulk acoustic wave through physical vibration.

The first electrode layer 202' and the second electrode layer 204' may be made of any suitable conductive materials or semiconductor materials known in the existing technology, where the conductive material may be a metal material with conductive properties, such as one metal or a stacked layer of the following metals including molybdenum (Mo), aluminum (Al), copper (Cu), tungsten (W), tantalum (Ta), platinum (Pt), ruthenium (Ru), rhodium (Rh), iridium (Ir), chromium (Cr), titanium (Ti), gold (Au), osmium (Os), rhenium (Re), palladium (Pd), and the like; and the semiconductor material may be, for example, Si, Ge, SiGe, SiC, SiGeC, and the like. The first electrode layer 202' and the second electrode layer 204' may be formed by a physical vapor deposition process or a chemical vapor deposition process such as magnetron sputtering, evaporation, and the like. The piezoelectric material layer 203' may also be called a piezoelectric resonance layer or a piezoelectric resonance part. The material of the piezoelectric material layer 203' may be one or a combination of piezoelectric materials with wurtzite crystal structure, including aluminum nitride (AlN), zinc oxide (ZnO), lead zirconate titanate (PZT), lithium niobate (LiNbO$_3$), quartz (Quartz), potassium niobate (KNbO$_3$), lithium tantalate (LiTaO$_3$), and the like. When the piezoelectric material layer 203' includes aluminum nitride (AlN), the piezoelectric material layer 203' may also include rare earth metals, such as at least one of scandium (Sc), erbium (Er), yttrium (Y), and lanthanum (La). Moreover, when the piezoelectric material layer 203' includes aluminum nitride (AlN), the piezoelectric material layer 203' may also include transition metals, such as at least one of zirconium (Zr), titanium (Ti), manganese (Mn), and hafnium (Hf). The piezoelectric material layer 203' may be deposited by any suitable process known to those skilled in the art, such as chemical vapor deposition, physical vapor deposition, or atomic layer deposition. Preferably, in one embodiment, the first electrode layer 202' and the second electrode layer 204' may be made of metallic molybdenum (Mo); and the piezoelectric material layer 203' may be made of aluminum nitride (AlN).

The shapes of the first electrode layer 202', the piezoelectric material layer 203', and the second electrode layer 204' may be same or different, and the areas of the first electrode layer 202', the piezoelectric material layer 203', and the second electrode layer 204' may be same or different. In one embodiment, the shapes and areas of the first electrode layer 202', the piezoelectric material layer 203', and the second electrode layer 204' are same, where the shapes may all be polygonal, such as square.

Before forming the first electrode layer 202', a seed layer (not shown in FIG. 3C) may be formed on the release layer 201. The seed layer may be formed between the release layer 201 and the first electrode layer 202'. The seed layer may guide the crystal orientation of the first electrode layer 202' (the piezoelectric material layer 203' and the second electrode layer 204') subsequently formed, which is convenient for the piezoelectric stacked layer structure formed subsequently to grow along a specific crystal orientation, thereby ensuring the uniformity of the piezoelectric layer. The material of the seed layer may be aluminum nitride (AlN). In addition to AlN, the seed layer may also be formed by a metal or a dielectric material having a hexagonal close packed (HCP) structure. For example, the seed layer may also be formed by metal titanium (Ti).

Figure 3D:
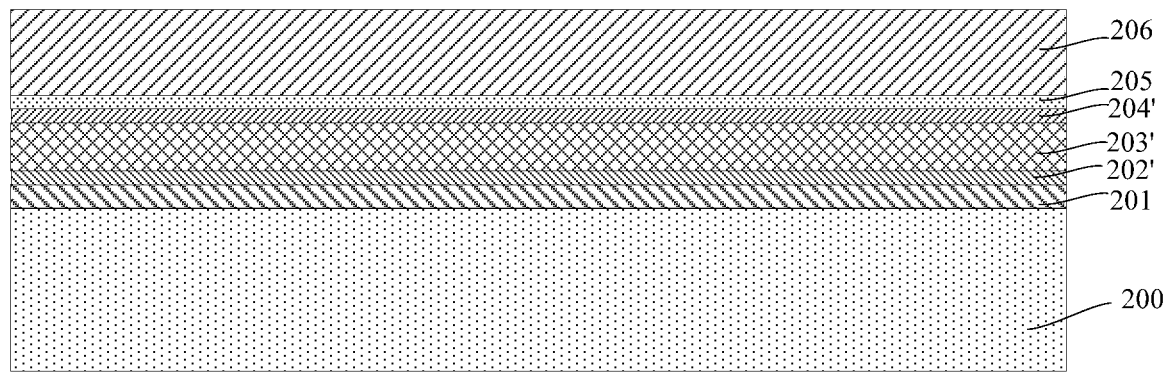
Figure 3E:
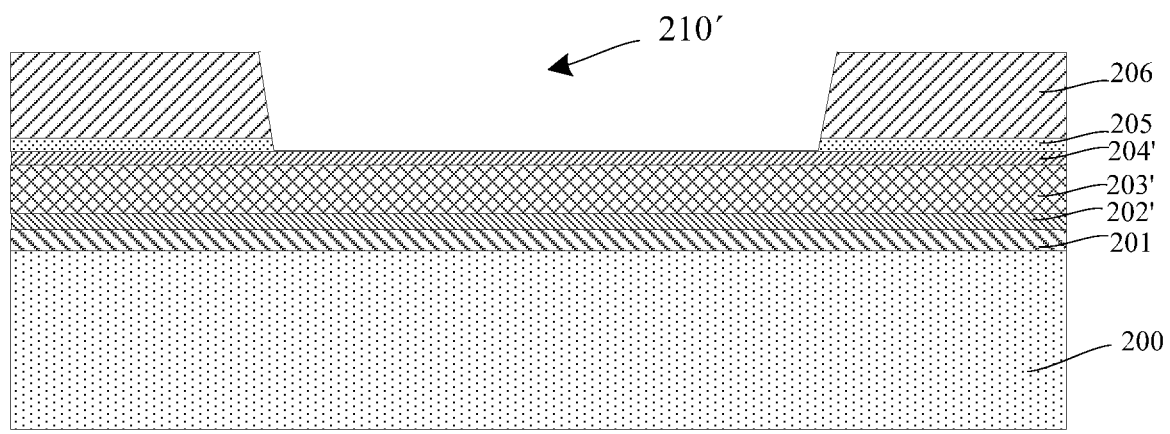

Next, as shown in FIG. 3D, step S02 may be performed to form a support layer 206 over the second electrode layer 204' and to form a cavity 210 with a top opening in the support layer 206, where the cavity 210 passes through the support layer 206. For example, the support layer 206 may be first formed by a chemical deposition process. The material of the support layer 206 may be, for example, one or a combination of silicon dioxide (SiO$_2$), silicon nitride (Si$_3$N$_4$), aluminum oxide (Al$_2$O$_3$), and aluminum nitride (AlN). The material of the support layer 206 in one embodiment may be silicon dioxide (SiO$_2$). Then, the support layer 206 may be etched by an etching process to form an opening 210' to expose a portion of the second electrode layer 204'. The etching process may be a wet etching process or a dry etching process; and the dry etching process may be preferably used. The dry etching processes may include, but may not be limited to, reactive ion etching (RIE), ion beam etching, plasma etching, or laser cutting. The depth and shape of the opening 210' may depend on the depth and shape of the cavity required by the bulk acoustic resonator to be fabricated; and the thickness of the cavity in the film bulk acoustic resonator is related to the resonance frequency. Therefore, the depth of the opening 210', that is, the thickness of the support layer 206, may be set according to the required resonance frequency of the film bulk acoustic resonator. Exemplarily, the depth of the opening 210' may be about 0.5 micrometer to about 3 micrometers, for example, 1 micrometer or 2 micrometers or 3 micrometers. The shape of the bottom surface of the opening 210' may be a rectangle or a polygon other than a rectangle, such as a pentagon, a hexagon, an octagon, and the like, and may also be a circle or an ellipse. The sidewall of the opening 210' may be inclined or vertical. In one embodiment, the bottom surface of the opening 210' may be a rectangle, and an obtuse angle may be formed between the side wall and the bottom surface (the shape of the longitudinal section of the opening 210' (the section along the thickness direction of the substrate) is an inverted trapezoid). In other embodiments of the present disclosure, the longitudinal cross-sectional shape of the opening 210' may also be a spherical crown with a wide top and a narrow bottom, that is, the longitudinal cross-section may be U-shaped.

In one embodiment, before forming the support layer 206, an etch stop layer 205 may be further formed on the second electrode layer 204'. The material of the etch stop layer 205 may include, but may not be limited to, silicon nitride (Si$_3$N$_4$) and silicon oxynitride (SiON). The etch stop layer 205 has a lower etch rate compared with the support layer 206 formed subsequently, which may prevent over-etching when the support layer 206 is subsequently etched to form the opening, thereby protecting the surface of the second electrode layer 204' under the etch stop layer 205 from being damaged.

Figure 3F:
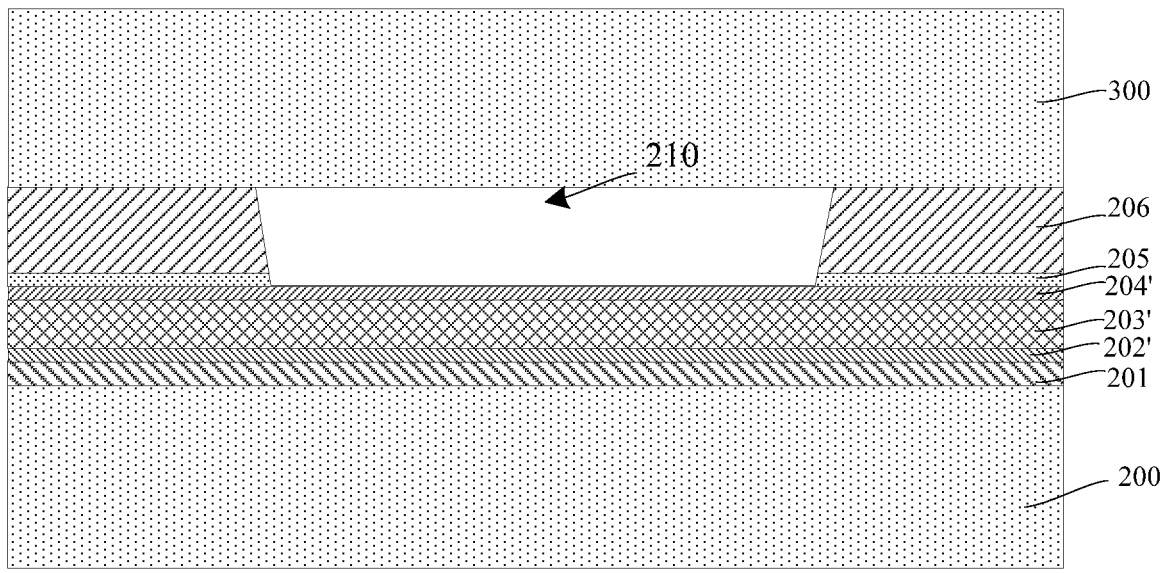
Figure 3G:
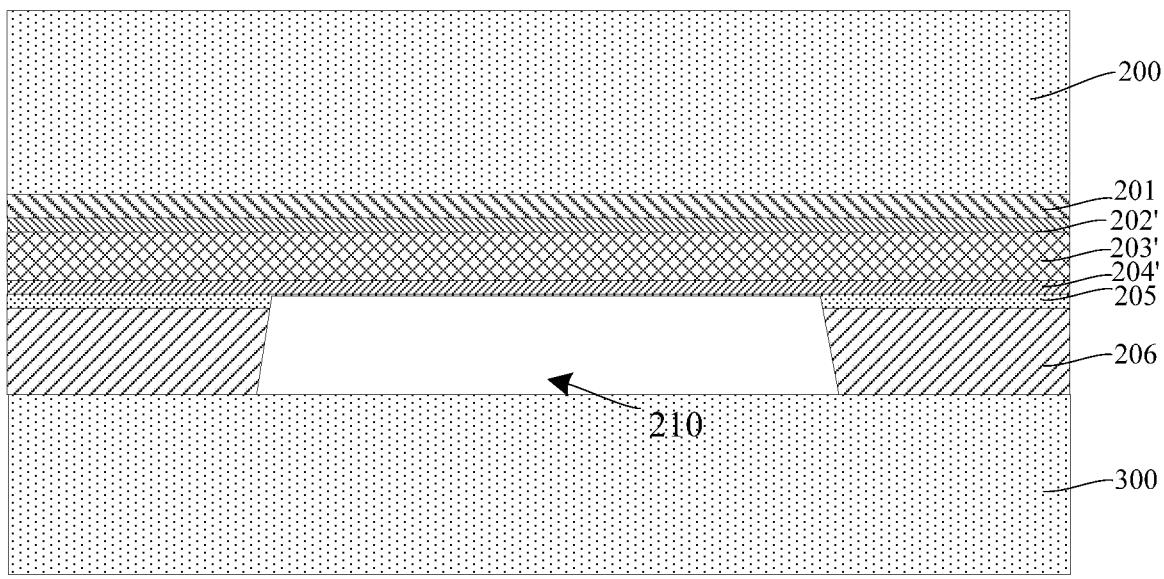

Next, as shown in FIG. 3F, step S03 may be performed to provide a second substrate 300 and to bond the second substrate 300 with the support layer 206. The second substrate 300 and the second electrode 204 may form the cavity 210 at the opening 210' of the support layer 206. The second substrate 300 may be any suitable substrate known to those skilled in the art. For example, the second substrate 300 may be at least one of the materials mentioned below: silicon (Si), germanium (Ge), silicon germanium (SiGe), silicon carbon (SiC), silicon germanium (SiGeC), indium arsenide (InAs), gallium arsenide (GaAs), indium phosphide (InP) or other III/V compound semiconductors. The second substrate 300 may also be a multilayer structure composed of such semiconductors; or silicon-on-insulator (SOI), silicon-on-insulator (SSOI), silicon-germanium-on-insulator (S—SiGeOI), silicon germanium-on-insulator (SiGeOI), and germanium-on-insulator (GeOI); or double side polished wafers (DSP), a ceramic substrate such as alumina, a quartz or glass substrate, and the like. The bonding of the second substrate 300 and the support layer 206 may be implemented by thermocompression bonding. In order to increase the bonding capability between the support layer 206 and the second substrate 300, a bonding layer may be disposed on the side of the support layer 206 for the thermocompression bonding. The bonding layer may be, for example, a silicon dioxide layer. In other embodiments of the present disclosure, other bonding manners may also be used for bonding. The second substrate 300 and the support layer 206 may be bonded into a single piece by dry film bonding. For example, a dry film layer may be disposed on the side of the second substrate 300 for bonding the dry film, and the second substrate 300 may be bonded to the support layer 206 through the dry film. After the bonding process is completed, the above-mentioned film bulk acoustic resonator after bonding may be turned over to obtain the structure shown in FIG. 3G.

Figure 3H:
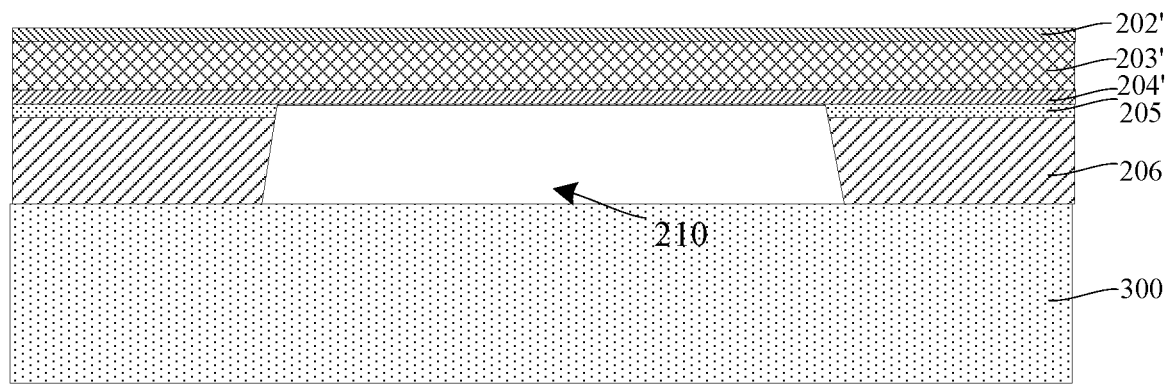

Next, as shown in FIG. 3H, step S04 may be performed to remove the first substrate 200. The first substrate 200 may be removed through a thinning process, a thermal release process, and a peeling process. For example, the release layer 201 may be made of a material including a dielectric material; and the release layer 201 and the first substrate 200 may be removed by the thinning process, such as mechanical polishing; the release layer 201 may be a light solidification adhesive, and the light solidification adhesive may be removed by a chemical agent to remove the first substrate 200; the release layer may be a thermally melt adhesive, and the thermally melt adhesive may lose its viscosity through a thermal release process to remove the first substrate 200. In other embodiments of the present disclosure, the first substrate 200 may also be removed by other manners, which are not listed in detail herein.

Figure 3I:
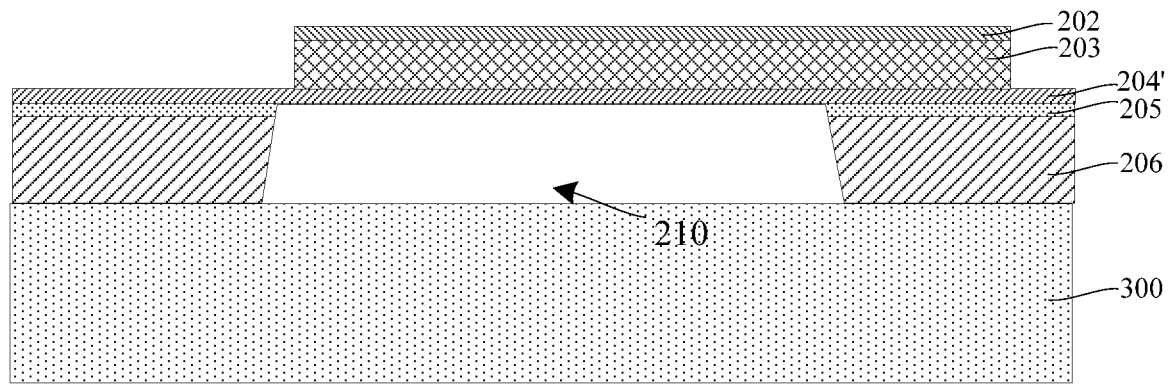

Next, as shown in FIG. 3I, step S05 may be performed to pattern the first electrode layer 202', the piezoelectric material layer 203', and the second electrode layer 204' to form a first electrode 202, a piezoelectric layer 203 and the second electrode 204. The overlapped region of the first electrode 202, the piezoelectric layer 203 and the second electrode 204 along the vertical direction (i.e., the thickness direction) may be at least partially located above the cavity 210.

After the patterning step, the second electrode 204 may not only cover the opening of the cavity 210 but also extend and cover a portion of the support layer 206 around the opening 210' (for example, directly cover the surface of the etch stop layer 205 above the support layer 206). That is, the second electrode 204 may not only completely enclose the cavity 210 but also adjoin the support layer 206. The portion of the second electrode 204 that adjoins the support layer 206 may be a closed loop structure formed by surrounding the opening of the cavity 210 for one turn. In other embodiments of the present disclosure, the second electrode 204 may be coplanar with the edge of the support layer 206.

After patterning the first electrode layer 202', the piezoelectric material layer 203', and the second electrode layer 204', the shapes of the first electrode 202 and the piezoelectric layer 203 formed may be same as or different from the shape of the second electrode 204; and the top-view shape may be pentagons or other polygons, such as quadrangles, hexagons, heptagons, or octagons. In one embodiment, after the patterning step, the first electrode 202 and the piezoelectric layer 203 may be completely overlapped with a same area, and the area of the second electrode 204 may be greater than the area of the opening of the cavity 210.

Figure 3J:
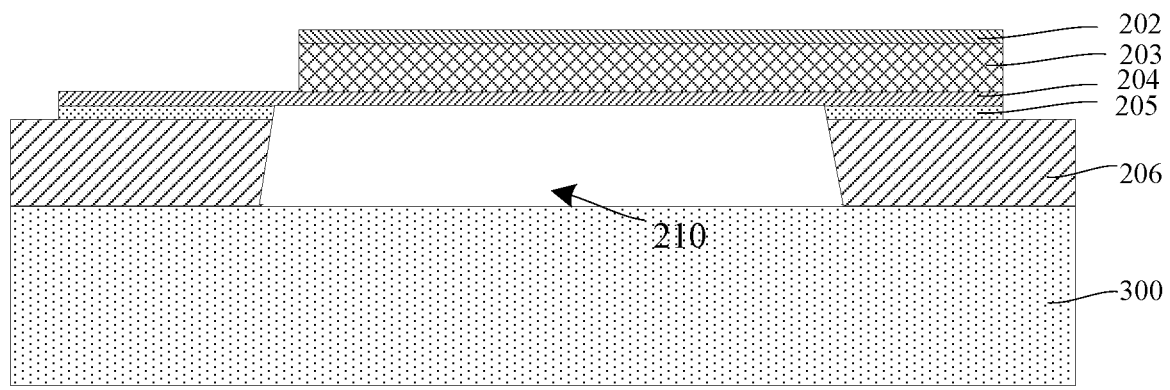

For example, the first electrode layer 202', the piezoelectric material layer 203', and the second electrode layer 204' may be patterned through photolithography and etching processes. Exemplarily, the electrode pattern of the first electrode 202 may be defined by a photolithography process, and the shape of the first electrode 202 may be formed by a dry etching process or a wet etching process. Then, using the first electrode 202 as a mask, the piezoelectric material layer 203' may be etched using a dry etching process or a wet etching process, as shown in FIG. 3I. Next, the electrode pattern of the second electrode 204 may be defined by a photolithography process, and the shape of the second electrode 204 may be formed by a dry etching process or a wet etching process, as shown in FIG. 3J. The patterned first electrode 202, the piezoelectric layer 203, and the second electrode 204 may have an overlapped region along the vertical direction. Therefore, after the first electrode 202 and the second electrode 204 are applied with a voltage, an electric field may be formed between such two electrodes, and the electric field may facilitate the piezoelectric layer 203 to generate mechanical vibrations. Moreover, the overlapped region may be at least partially located above the cavity 210, and a portion of the second electrode 204 above the cavity 210 may be exposed. That is, the overlapped region, along the thickness direction, of the first electrode 202, the piezoelectric layer 203, and the second electrode 204 located above the cavity 210 may be an active working region (effective working region) of the bulk acoustic resonator. Such arrangement may relatively reduce the dissipation of acoustic wave energy and improve the quality factor of the bulk acoustic resonator.

Figure 3K:
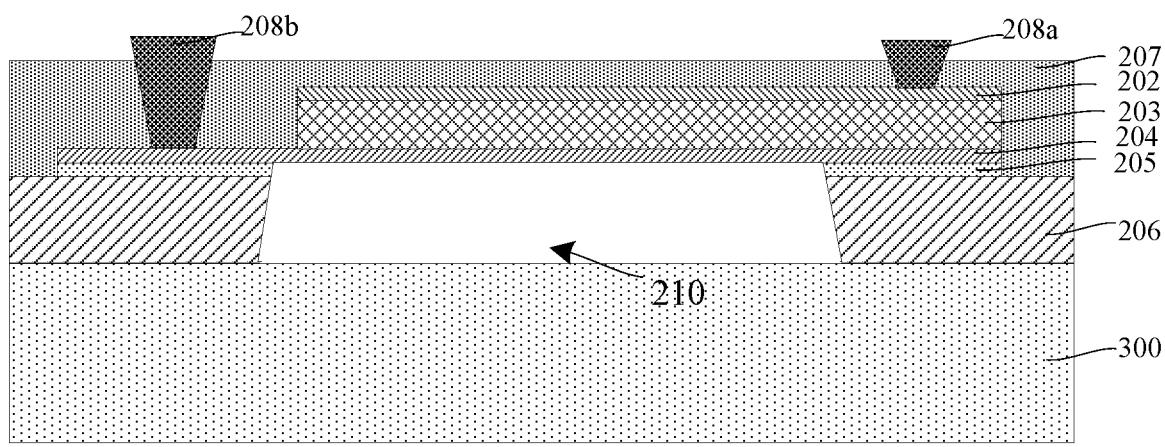

Moreover, after patterning the first electrode layer 202', the piezoelectric material layer 203', and the second electrode layer 204' to form the first electrode 202, the piezoelectric layer 203, and the second electrode 204, the method for fabricating the film bulk acoustic resonator provided by the present disclosure may further include forming a passivation layer 207. The passivation layer 207 may cover the first electrode 202, the piezoelectric layer 203, and the second electrode 204, and further cover the support layer 206. Passivation layer openings may be formed in the passivation layer 207 above the support layer 206 and in the passivation layer 207 above the second electrode 204, respectively, where a part of the passivation layer openings may expose the second electrode 204, and another part of the passivation layer openings may expose the second electrode 202. A first soldering pad 208a and a second soldering pad 208b, which are electrically connected to the first electrode 202 and the second electrode 204, may be respectively formed at the passivation layer openings, as shown in FIG. 3K. For example, the passivation layer 207 may be formed by chemical deposition or thermal oxidation. The material of the passivation layer 207 may be silicon dioxide ($SiO_2$), silicon nitride ($Si_3N_4$), silicon oxynitride (SiON), aluminum nitride (AlN), aluminum oxide ($Al_2O_3$), and the like. Then, the passivation layer 207 may be etched to form the passivation layer openings on the first electrode 202 and the second electrode 204 as electrode lead-out windows. Finally, a conductive material such as metal may be filled in the passivation layer openings to form the first soldering pad 208a and the second soldering pad 208b which are electrically connected to the first electrode 202 and the second electrode 204, respectively, thereby further realizing the connection between the electrodes of the film bulk acoustic resonator and an external power supply device. The material of each of the first soldering pad 208a and the second soldering pad 208b may be a composite structure formed by one or a combination of aluminum (Al), copper (Cu), gold (Au), titanium (Ti), nickel (Ni), silver (Ag), tungsten (W) and the like. Preferably, in one embodiment, the first soldering pad 208a and the second soldering pad 208b may be aluminum soldering pads; and the first soldering pad 208a and the second soldering pad 208b may be located on two sides of the cavity 210, respectively.

In the above-mentioned etching steps, the etching manners may include, but may not be limited to, a wet etching technology, an inductively coupled plasma (ICP) etching process, a reactive ion etching (RIE) process, and the like. The deposition manners may include, but may not be limited to, a chemical vapor deposition process, a magnetron sputtering process, an electrochemical deposition process, an atomic layer deposition (ALD) process, a molecular beam epitaxy (MBE) process, and the like.

The embodiments of the present disclosure also provide a film bulk acoustic resonator, which is fabricated by using the above-mentioned fabrication method of the film bulk acoustic resonator. As shown in FIG. 3K, the film bulk acoustic resonator may include:
the second substrate 300;
the support layer 206 disposed on the second substrate 300, where the support layer 206 may be bonded to the second substrate 300, and the cavity 210, passing through the support layer 206, may be disposed in the support layer 206; and
the second electrode 204, the piezoelectric layer 203, and the first electrode 202 sequentially disposed on the support layer 206.

The cavity 210 may be disposed in the support layer 206 below the overlapped region, along the thickness direction, of the first electrode 202, the piezoelectric layer 203, and the second electrode 204. The second electrode 204 may cover the opening of the cavity 210 and a portion of the support layer 206 around the opening. The portion of the second electrode 204 that adjoins the support layer 206 may a closed loop structure formed by surrounding the opening of the cavity 210 for one turn. In other embodiments of the present disclosure, the second electrode 204 may be coplanar with the edge of the support layer 206.

The second substrate 300 may be any suitable substrate known to those skilled in the art. For example, the second substrate 300 may be at least one of the materials mentioned below: silicon (Si), germanium (Ge), silicon germanium (SiGe), silicon carbon (SiC), silicon germanium (SiGeC), indium arsenide (InAs), Gallium arsenide (GaAs), indium phosphide (InP) or other III/V compound semiconductors. The second substrate 300 may be a multilayer structure composed of such semiconductors; or silicon-on-insulator (SOI), silicon-on-insulator (SSOI), silicon-germanium-on-insulator (S—SiGeOI), silicon germanium-on-insulator (SiGeOI), and germanium-on-insulator (GeOI); or double side polished wafers (DSP), a ceramic substrate such as alumina, a quartz or glass substrate, and the like. In one embodiment, the first electrode 202 and the second electrode 204 may be made of metal molybdenum (Mo), and the piezoelectric layer 203 may be made of aluminum nitride (AlN). The material of the support layer 206 may be, for example, one or a combination of silicon dioxide ($SiO_2$), silicon nitride ($Si_3N_4$), aluminum oxide ($Al_2O_3$) and aluminum nitride (AlN). Preferably, the material of the support layer 206 may be silicon dioxide ($SiO_2$).

Optionally, the areas of the first electrode 202 and the piezoelectric layer 203 may be equal and completely overlapped, and the area of the second electrode 204 may be greater than the area of the opening of the cavity 210. The overlapped region, along the thickness direction, of the first electrode 202, the piezoelectric layer 203, and the second electrode 204 located above the cavity 210 may be an active working region (effective working region) of the bulk acoustic resonator. Such arrangement may relatively reduce the dissipation of acoustic wave energy and improve the quality factor of the bulk acoustic resonator.

The support layer 206 may be bonded to the second substrate 300 by a thermocompression bonding manner or a dry film bonding manner. Using the thermocompression bonding manner, a bonding layer may be disposed on a side of the support layer for bonding with the second substrate by the thermocompression bonding. Using the dry film bonding manner, a dry film layer may be disposed on a side of the second substrate for bonding with the support layer by the dry film bonding.

Optionally, the etch stop layer 205 may be disposed between the second electrode 204 and the support layer 206. Furthermore, the etch stop layer 205 and the second electrode 204, having a same shape and a same area, may be completely overlapped with each other. The material of the etch stop layer 205 may include, but may not be limited to, silicon nitride ($Si_3N_4$) and silicon oxynitride (SiON).

Optionally, the film bulk acoustic resonator may further include the passivation layer 207. The passivation layer 207 may cover the first electrode 202, the piezoelectric layer 203, the second electrode 204, and the support layer 206.

Optionally, passivation layer openings, different from the cavity 210, may be respectively formed in the passivation layer 207 above the support layer 206 and in the passivation layer 207 above the second electrode 204. The film bulk acoustic resonator may further include at least two soldering pads. The soldering pads, disposed at the passivation layer 207, may be electrically connected to the first electrode 202 and the second electrode 204 respectively through the openings of the passivation layer 207. For example, the first soldering pad 208a may be electrically connected to the first electrode 202, and the second soldering pad 208b may be electrically connected to the second electrode 204. Preferably, the first soldering pad 208a and the second soldering pad 208b may be located on two sides of the cavity 210, respectively.

From the above-mentioned embodiments, it can be seen that the technical solutions provided by the present disclosure may achieve at least the following beneficial effects.

The present disclosure provides the film bulk acoustic resonator and its fabrication method. The first electrode layer, the piezoelectric material layer, and the second electrode layer may be sequentially formed on the first substrate. Then, the support layer may be formed on the second electrode layer and the cavity with the top opening may be formed in the support layer, where the cavity passes through the support layer. Next, the second substrate may be bonded with the support layer, and the first substrate may be removed; and the first electrode layer, the piezoelectric material layer, and the second electrode layer may be patterned to form the first electrode, the piezoelectric layer, and the second electrode, such that the overlapped region of the first electrode, the piezoelectric layer, and the second electrode along the thickness direction may be directly above the cavity. The cavity structure of the film bulk acoustic filter may be realized through the etching support layer and the bonding process, which avoids the influence of slight fluctuations between different media caused by the CMP process on the uniformity of the piezoelectric layer and avoids the influence on the performance of the film bulk acoustic wave filter due to incompletely dissolving the sacrificial layer.

It should be noted that each embodiment in present specification may be described in a related manner, and the same or similar parts between the various embodiments may be referred to each other. Each embodiment may focus on the differences from other embodiments. Particularly, as for the structural embodiments, since it is basically similar to the method embodiments, the description may be relatively simple, and related parts may refer to the partial description of the method embodiments.

The above-mentioned description may merely the description of preferred embodiments of the present disclosure and may not limit the scope of the present disclosure in any way. Any changes or modifications made by those skilled in the art in the field of the present disclosure according to the above-mentioned description shall fall within the protection scope of the claims.

What is claimed is:

1. A film bulk acoustic resonator, comprising: a substrate; a support layer bonded on the substrate, wherein a cavity, passing through the support layer, is in the support layer; and a second electrode, a piezoelectric layer, and a first electrode which are sequentially disposed in the support layer, wherein sidewalls of one end of the first electrode and one end of the piezoelectric layer are coplanar with each other and are within the cavity along a vertical direction of the substrate, and the second electrode covers the cavity and extends at least partially over the support layer outwards the cavity along a lateral direction of the substrate, an etch stop layer is disposed between the second electrode and the support layer and sidewalls of an end of each of the second electrode, the piezoelectric layer, the first electrode and the etch stop layer are coplanar with each other and are outside of the cavity along the vertical direction of the substrate.

2. The film bulk acoustic resonator according to claim 1, wherein:
the support layer is bonded with the substrate by thermocompression bonding or dry film bonding.

3. The film bulk acoustic resonator according to claim 2, wherein:
a bonding layer is disposed on a side of the support layer for bonding with the substrate by the thermocompression bonding.

4. The film bulk acoustic resonator according to claim 2, wherein:
a dry film layer is disposed on a side of the substrate for bonding with the support layer by the dry film bonding.

5. The film bulk acoustic resonator according to claim 1, further including:
a passivation layer, covering the first electrode, the piezoelectric layer, and the second electrode, and
a bottommost surface of the passivation layer is in contact with a top surface of the support layer on both sides of each of the first electrode, the piezoelectric layer, and the second electrode.

6. The film bulk acoustic resonator according to claim 1, further including:
soldering pads, disposed outside the cavity along the vertical direction of the substrate, and electrically connected to the first electrode and the second electrode, respectively.

7. The film bulk acoustic resonator according to claim 1, wherein:
a thickness of the support layer is about 0.5 micrometer to about 3 micrometers.

8. The film bulk acoustic resonator according to claim 1, wherein: sidewalls of both ends of each of the second electrode and the etch layer are coplanar with each other and are outside of the cavity along the vertical direction of the substrate.

9. The film bulk acoustic resonator according to claim 1, wherein:
sidewalls of an end of each of the second electrode, the piezoelectric layer, and the first electrode are coplanar with each other and are outside of the cavity along the vertical direction of the substrate.

10. The film bulk acoustic resonator according to claim 1, wherein:
the support layer is made of a material comprising silicon oxide, silicon nitride, aluminum oxide, aluminum nitride, or a combination thereof.

11. The film bulk acoustic resonator according to claim 5, wherein:
the passivation layer is made of a material comprising silicon dioxide, silicon nitride, silicon oxynitride, aluminum nitride, aluminum oxide, or a combination thereof.

* * * * *